(12) United States Patent
Dubourdieu et al.

(10) Patent No.: US 8,890,112 B2
(45) Date of Patent: Nov. 18, 2014

(54) CONTROLLING FERROELECTRICITY IN DIELECTRIC FILMS BY PROCESS INDUCED UNIAXIAL STRAIN

(75) Inventors: Catherine A. Dubourdieu, New York City, NY (US); Martin M. Frank, Dobbs Ferry, NY (US)

(73) Assignees: International Business Machines Corporation, Armonk, NY (US); Centre National de la Recherche Scientifique (FR)

( * ) Notice: Subject to any disclaimer, the term of this patent is extended or adjusted under 35 U.S.C. 154(b) by 162 days.

(21) Appl. No.: 13/557,385

(22) Filed: Jul. 25, 2012

(65) Prior Publication Data

US 2012/0286340 A1     Nov. 15, 2012

Related U.S. Application Data

(62) Division of application No. 12/753,270, filed on Apr. 2, 2010, now Pat. No. 8,389,300.

(51) Int. Cl.

| | |
|---|---|
| *H01L 21/02* | (2006.01) |
| *H01L 29/66* | (2006.01) |
| *H01L 49/02* | (2006.01) |
| *H01L 29/78* | (2006.01) |
| *H01L 21/28* | (2006.01) |

(52) U.S. Cl.
CPC .... *H01L 21/28291* (2013.01); *H01L 29/66636* (2013.01); *H01L 28/55* (2013.01); *H01L 29/784* (2013.01); *H01L 29/7843* (2013.01); *H01L 29/7848* (2013.01); *H01L 29/6684* (2013.01)
USPC .......................... 257/9; 257/12; 257/E33.009

(58) Field of Classification Search
CPC ............ H01L 29/7848; H01L 29/6684; H01L 21/28291
USPC ....................................................... 257/9–12
See application file for complete search history.

(56) References Cited

U.S. PATENT DOCUMENTS

| | | |
|---|---|---|
| 3,740,118 A | 6/1973 | Land et al. |
| 3,741,627 A | 6/1973 | Haertling et al. |
| 5,146,299 A | 9/1992 | Lampe et al. |

(Continued)

FOREIGN PATENT DOCUMENTS

| | | |
|---|---|---|
| DE | 112007001161 T5 | 5/2009 |
| JP | 5090600 A | 4/1993 |
| JP | 2007099618 A2 | 4/2007 |

OTHER PUBLICATIONS

S. Bhattacharjee et al.; "Engineering Multiferroism in CaMnO3;" Physical Review Letters 102; Mar. 20, 2009; pp. 117602-1-4.

(Continued)

*Primary Examiner* — Michael Lebentritt
(74) *Attorney, Agent, or Firm* — Cantor Colburn LLP; Vazken Alexanian (57) ABSTRACT

A method of controlling ferroelectric characteristics of integrated circuit device components includes forming a ferroelectrically controllable dielectric layer over a substrate; and forming a stress exerting structure proximate the ferroelectrically controllable dielectric layer such that a substantially uniaxial strain is induced in the ferroelectrically controllable dielectric layer by the stress exerting structure; wherein the ferroelectrically controllable dielectric layer comprises one or more of: a ferroelectric oxide layer and a normally non-ferroelectric material layer that does not exhibit ferroelectric properties in the absence of an applied stress.

14 Claims, 6 Drawing Sheets

(56) References Cited

U.S. PATENT DOCUMENTS

| | | | |
|---|---|---|---|
| 5,621,681 | A | 4/1997 | Moon |
| 5,744,374 | A | 4/1998 | Moon |
| 5,830,270 | A | 11/1998 | McKee et al. |
| 6,010,744 | A | 1/2000 | Buskirk et al. |
| 7,229,662 | B2 | 6/2007 | Wang et al. |
| 7,371,473 | B2 | 5/2008 | Kijima et al. |
| 7,449,738 | B2 | 11/2008 | Eom et al. |
| 7,466,579 | B2 | 12/2008 | Bednorz et al. |
| 8,389,300 | B2 * | 3/2013 | Dubourdieu et al. ............ 438/3 |
| 2003/0201475 | A1 | 10/2003 | Uchiyama et al. |
| 2005/0052823 | A1 | 3/2005 | Kurasawa et al. |
| 2007/0018328 | A1 | 1/2007 | Hierlemann et al. |
| 2007/0080383 | A1 | 4/2007 | Yamakawa et al. |
| 2007/0284613 | A1 | 12/2007 | Chui et al. |
| 2008/0026165 | A1 | 1/2008 | Salters et al. |
| 2008/0062615 | A1 | 3/2008 | Rappe et al. |
| 2008/0258180 | A1 | 10/2008 | Chen et al. |
| 2009/0057737 | A1 | 3/2009 | Boescke et al. |
| 2009/0104746 | A1 | 4/2009 | Clifton et al. |
| 2009/0155931 | A1 | 6/2009 | Ma et al. |
| 2009/0302886 | A1 | 12/2009 | Karg et al. |
| 2009/0305474 | A1 | 12/2009 | Bryant et al. |
| 2010/0195381 | A1 | 8/2010 | Karg et al. |

OTHER PUBLICATIONS

C. Bungaro et al.; "Epitazially strained [001]-(PbTiO3)1(PbZrO3)1 superlattice and PbTiO3 from first principles;" Physical Review B69; 2004; pp. 18101-1-18101-8.

K.J. Choi et al.; "Enhancement of Ferroelectricity in Strained BaTiO3 Thin Films;" Science 306; (2004); p. 1005-1009.

M. Dawber et al.; "Physics of thin-film ferroelectric oxides;" Reviews of Modern Physics, vol. 77, Oct. 2005; pp. 1083-1130.

C. Ederer et al.; "Effect of Epitaxial Strain on the Spontaneous Polarization of Thin Film Ferrelectrics;" Physical Review Letters 95; 2005; pp. 257601-1-4.

J. H. Haenl et al.; "Room-temperature ferroelectricity in strained SrTio3;" Letters to Nature; vol. 430; Aug. 12, 2004; pp. 758-761.

J. B. Neation et al.; "First-principles study of spontaneous polarization in multiferroic BiFeO3;" Physical Review B71; 2005; pp. 014113-1-8.

International Search Report: International Application No. PCT/US 11/28422; International Filing Date: Mar. 15, 2011; Date of Mailing: Jun. 1, 2011; pp. 1-7.

International Search Report—Written Opinion: International Application No. PCT/US 11/28422; International Filing Date: Mar. 15, 2011; Date of Mailing: Jun. 1, 2011; pp. 1-7.

Takahiro Shimada & Takayuki Kitamura, "Multi-physics Properties in Ferroelectric Nanowires and Related Structures from First-principles," Nanowires, Ch. 18, pp. 1-20; Mar. 2010.

S. Salahuddin et al.; "Use of Negative Capacitance to Provide Voltage Amplification for Low Power Nanoscale Devices;" Nano Letters, vol. 8, No. 2; 2008; pp. 405-410.

M. Stengel et al.; "Origin of the dielectric dead layer in nanoscale capacitors;" Nature Letters, vol. 443; Oct. 2006; pp. 679-682.

M. P. Warusawithana et al.; "A Ferroelectric Oxide Made Directly on Silicon;" Science 324; (2009); pp. 367-370.

B. Yang et al.; "Recent Progress and Challenges in Enabling Embedded Si:C Technology;" ECS Trans. 16; 2008; pp. 317-323.

V. V. Zhirnov et al.; "Nanoelectronics: Negative capacitance to the rescue?" Nature Nanotechnology vol. 3; Feb. 2008; pp. 77-78.

Deutsches, Patent- und Markenamt, DE Office Action; Mailed: Dec. 18, 2012, pp. 1-10.

* cited by examiner

CONTROLLING FERROELECTRICITY IN DIELECTRIC FILMS BY PROCESS INDUCED UNIAXIAL STRAIN

CROSS-REFERENCE TO RELATED APPLICATION

This application is a divisional of U.S. patent application Ser. No. 12/753,270, filed Apr. 2, 2010, now U.S. Pat. No. 8,389,300, the disclosure of which is incorporated by reference herein in its entirety.

BACKGROUND

The present invention relates generally to semiconductor devices and, more particularly, to controlling ferroelectricity in dielectric films by process-induced strain therein.

Integrated ferroelectrics have many current or potential future uses in microelectronics, including, for example, ferroelectric field effect transistor (FET) memory, ferroelectric metal-insulator-metal (MIM) capacitor memory, and ultra low-power/voltage complementary metal oxide semiconductor (CMOS) logic, to name a few.

At present, there are few good candidate ferroelectric materials for such applications, due to a large number of requirements (e.g., a ferroelectric transition temperature ($T_c$) well above room temperature, high remanent polarization, good retention, low fatigue, etc.). One such production-worthy material is lead zirconate titanate ($Pb[Zr_xTi_{1-x}]O_3$ $0<x<1$, or PZT by its chemical formula). PZT is a ceramic material with a perovskite crystal structure that shows substantial ferroelectricity, i.e., generation of spontaneous electric polarization (electric dipoles) in the presence of an electric field. However, one disadvantage of using PZT in microelectronic applications is the introduction of lead (Pb) into the manufacturing line, which creates environmental concerns. Also, PZT exhibits a considerable loss of switchable polarization with cumulative switching cycles.

Another such ferroelectric material is $SrBi_2Ta_2O_9$ or SBT. One disadvantage associated with SBT (in addition to the complexity of the composition of SBT, having three metal ions) relates to process control concerns, such as high processing temperatures. Other potential ferroelectric candidates have too low a transition temperature, $T_c$, or too low a spontaneous or remanent polarization, $P_r$, for some applications. For example, $BaTiO_3$ has a $T_c$ of about 120° C., which is too close to room temperature for applications at room temperature.

Consequently, other approaches have focused on significantly enhancing and/or tuning $T_c$ or $P_r$ in ferroelectric materials through the introduction of biaxial strain. Biaxial strain in ferroelectric thin films has thus far been achieved experimentally by coherent epitaxy of the ferroelectric material on a substrate (e.g., oxide) with low lattice mismatch. For example, biaxial strain in $BaTiO_3$ thin films (achieved by coherent epitaxy on scandate substrates such as $DyScO_3$ or $GdScO_3$) can result in a ferroelectric transition temperature $T_c$ nearly 500° C. higher and a remanent polarization $P_r$ at least 250% higher than in bulk $BaTiO_3$ single crystals. In this case, the strain is biaxial and compressive. In addition, biaxial strain may also be achieved in other ferroelectrics such as $PbTiO_3$ or $BiFeO_3$ via epitaxy. Yet other approaches have focused on inducing ferroelectricity in normally non-ferroelectric materials through the introduction of biaxial strain. For example, biaxial strain in $SrTiO_3$ films (achieved by coherent epitaxy on scandate substrates such as $DyScO_3$ or $GdScO_3$) can result in ferroelectricity at room temperature.

However, the biaxial strain of ferroelectrics via epitaxy has its own limitations. For example, direct epitaxy on silicon requires molecular beam epitaxy (MBE) deposition for high quality epitaxy. Here, the strain cannot be tuned, and once a critical thickness is achieved the strain is relaxed. Thus, the modulated ferroelectric properties can be obtained only for a limited thickness range. Moreover, direct epitaxy of a ferroelectric oxide such as $BaTiO_3$ on Si leads to high leakage currents due to a negative or very small band offset with respect to the silicon conduction band.

SUMMARY

In an exemplary embodiment, a method of controlling ferroelectric characteristics of integrated circuit device components includes forming a ferroelectrically controllable dielectric layer over a substrate; and forming a stress exerting structure proximate the ferroelectrically controllable dielectric layer such that a substantially uniaxial strain is induced in the ferroelectrically controllable dielectric layer by the stress exerting structure; wherein the ferroelectrically controllable dielectric layer comprises one or more of: a ferroelectric oxide layer and a normally non-ferroelectric material layer that does not exhibit ferroelectric properties in the absence of an applied stress.

In another embodiment, a ferroelectric field effect transistor (FET) device includes a ferroelectrically controllable gate dielectric layer disposed between a gate electrode and a substrate; and a stress exerting structure formed proximate the ferroelectrically controllable dielectric layer such that a substantially uniaxial strain is induced in the ferroelectrically controllable dielectric layer by the stress exerting structure; wherein the ferroelectrically controllable gate dielectric layer comprises one or more of: a ferroelectric oxide layer and a normally non-ferroelectric material layer that does not exhibit ferroelectric properties in the absence of an applied stress.

In still another embodiment, a ferroelectric metal-insulator-metal (MIM) capacitor includes a lower electrode layer formed over a substrate; a capacitor dielectric layer including a ferroelectrically controllable dielectric layer formed over the lower electrode; an upper electrode layer formed over the ferroelectrically controllable dielectric layer; and a stress exerting structure formed proximate the ferroelectrically controllable dielectric layer such that a substantially uniaxial strain is induced in the ferroelectrically controllable dielectric layer; wherein the ferroelectrically controllable gate dielectric layer comprises one or more of: a ferroelectric oxide layer and a normally non-ferroelectric material layer that does not exhibit ferroelectric properties in the absence of an applied stress.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein are methods and structures for controlling ferroelectricity in dielectric films by process-induced strain of the film. Certain exemplary embodiments are used to induce ferroelectricity, wherein a normally non-ferroelectric material when not strained, such as $SrTiO_3$ or $CaMnO_3$ for example, becomes ferroelectric when strained. Other exemplary embodiments tune the existing ferroelectricity of dielectric films, wherein the properties ($T_c$, $P_r$) of ferroelectrics in their processed state are modulated, thus widening the spectrum of possible materials (such as $BaTiO_3$, for example) that may be used in microelectronic applications, as well as to improve the performance of existing ferroelectric devices (such as PZT based devices, for example).

In the embodiments described herein, ferroelectrically controllable materials, such as normally non-ferroelectric materials or ferroelectric materials, initially deposited on silicon or other types of semiconductor substrates (e.g., silicon-on-insulator (SOI), Ge, III/V, etc.) are strained substantially uniaxially by CMOS-type techniques. "Substantially uniaxially," as used herein, describes a strain introduced in one direction of a surface, such as an x-direction or a y-direction. This is in contrast to, for example, a biaxial strained film that has strain introduced in two directions (x-y) along its surface. It should be understood, however, that "substantially uniaxially" may also describe strain primarily along one axis (e.g., the x-axis) with some minimal, "de minimis," or non-zero strain component along the other axis. In addition, "CMOS-type" techniques as described herein may include, for example, source/drain silicon germanium (SiGe) regions adjacent a silicon channel region, nitride liner formation, and combinations thereof.

In any case, no epitaxy of the dielectric film is required, and both compressive and tensile strain (uniaxial) can be achieved (using silicon nitride), and the level of strain can be modulated thus significantly modulating $T_c$ and $P_r$. Implementation of process-induced strain in ferroelectric oxides can thus be achieved through integration schemes common in chip technology, currently employed for enhancing mobility in the transistor channel. Practical embodiments of tuned ferroelectric dielectric films by process-induced strain include, but are not limited to, FETs and MIM capacitors.

Figure 1:
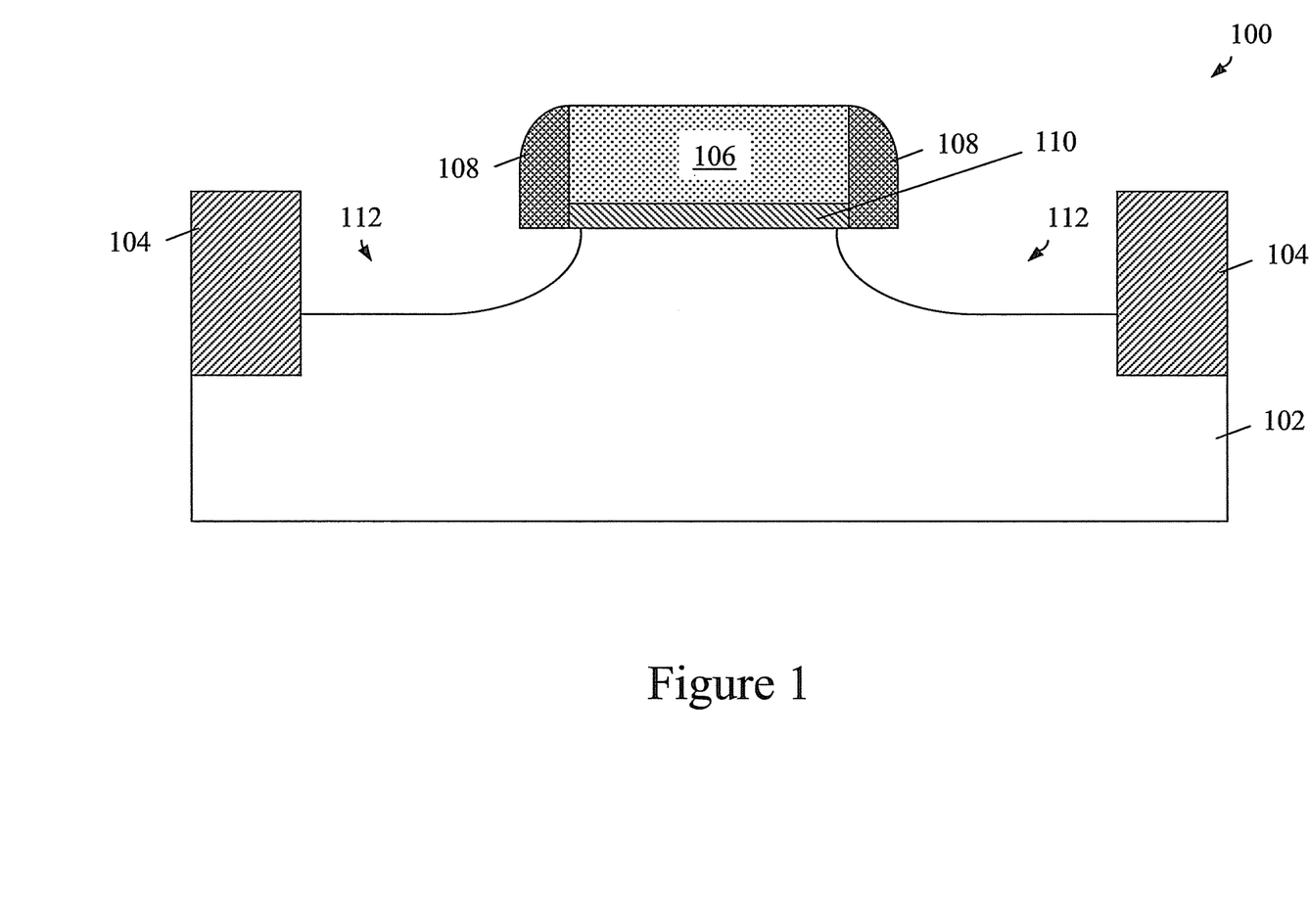
FIG. 1 is a cross-sectional view of an FET having a gate dielectric layer that is ferroelectrically controllable by strain engineering, in accordance with an embodiment of the invention.

Referring initially to FIG. 1, there is shown a cross-sectional view of an FET 100 formed in a substrate 102, such as silicon or SOI for example. The transistor, formed between shallow trench isolation (STI) regions 104, includes a patterned gate electrode 106, sidewall spacers 108 adjacent the gate electrode 106, and a gate dielectric layer 110 between the gate electrode 106 and the substrate 102. Here, a conventional material for the gate dielectric layer 110 (such as silicon dioxide, for example) is replaced by a dielectric stack containing a ferroelectrically controllable layer. Again, a ferroelectrically controllable layer may be a layer such as a ferroelectric material or a normally non-ferroelectric material that exhibits ferroelectric properties upon application of an external stress thereto. Non-limiting examples of a ferroelectrically controllable layer included within the gate dielectric layer 110 include $BaTiO_3$, PZT, SBT, $SrTiO_3$ (STO), $Ba_{1-x}Sr_xTiO_3$ (BST), $PbTiO_3$, $CaMnO_3$ and $BiFeO_3$.

In the case of bulk $SrTiO_3$, oxygen rotation is responsible for a non-polar, antiferrodistortive ground state. Both ferroelectric and antiferrodistortive distortions can coexist under appropriate strain, and the change in the coupling between these instabilities can be such that it leads to a new ground state (i.e., ferroelectric). As such, there is no obvious fundamental reason why uniaxial stress (resulting in a uniaxial strain or possibly in a more complex strain distribution) would not result in a change in the ground state of such strongly correlated complex oxide.

Although the gate dielectric layer 110 illustrated in FIG. 1 is depicted as being patterned with gate electrode such that the spacers 108 also abut the sidewalls of the gate dielectric layer 110, it is also contemplated that the gate dielectric layer 110 could be separately patterned with respect to the gate electrode 110 such that (for example) the spacers 108 are disposed atop the gate dielectric layer 110. In addition to the ferroelectrically controllable layer, the dielectric layer 110 may also include one or more buffer layers between the ferroelectrically controllable layer and the substrate 102. Moreover, the dielectric layer 110 shown in FIG. 1 may also include one or more additional dielectric layers disposed between the ferroelectrically controllable layer and the gate electrode 110, and/or the substrate 102.

Figure 2:
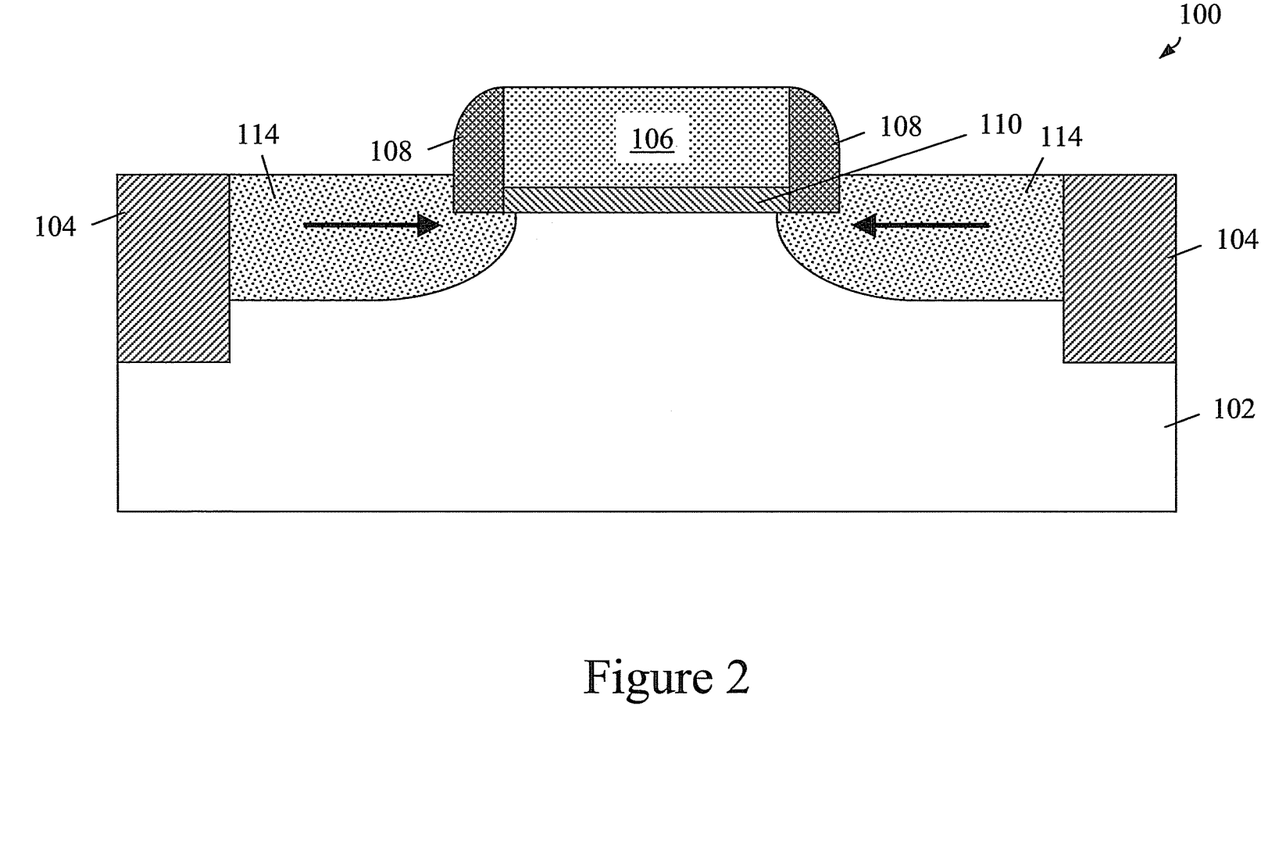
FIG. 2 illustrates the formation of epitaxial source and drain regions providing a substantially uniaxial strain on the ferroelectrically controllable gate dielectric layer of the FET of FIG. 1.

As will also be noted from FIG. 1, the source and drain regions 112 have been removed such as by etching to make way for epitaxial growth of a different semiconductor material, such as silicon germanium (SiGe) or carbon-doped silicon (Si:C). The epitaxial material 114 is illustrated in FIG. 2. As a result, a uniaxial compressive or tensile strain is induced on not only the channel region of the transistor below the gate dielectric layer 110, but also in the gate dielectric layer 110 itself. For example, where the epitaxial material 114 is SiGe, the induced uniaxial strain is compressive. Alternatively, if the epitaxial material 114 is Si:C, for example, the induced uniaxial strain is tensile. Thereby, the epitaxially induced stress on the gate dielectric layer 110 induces and/or modulates the ferroelectric properties of the gate dielectric layer 110. In still a further contemplated embodiment, the source and drain regions 112 may be provided with embedded stress exerting semiconductor material through the use of dopant implantation into silicon.

Figure 3:
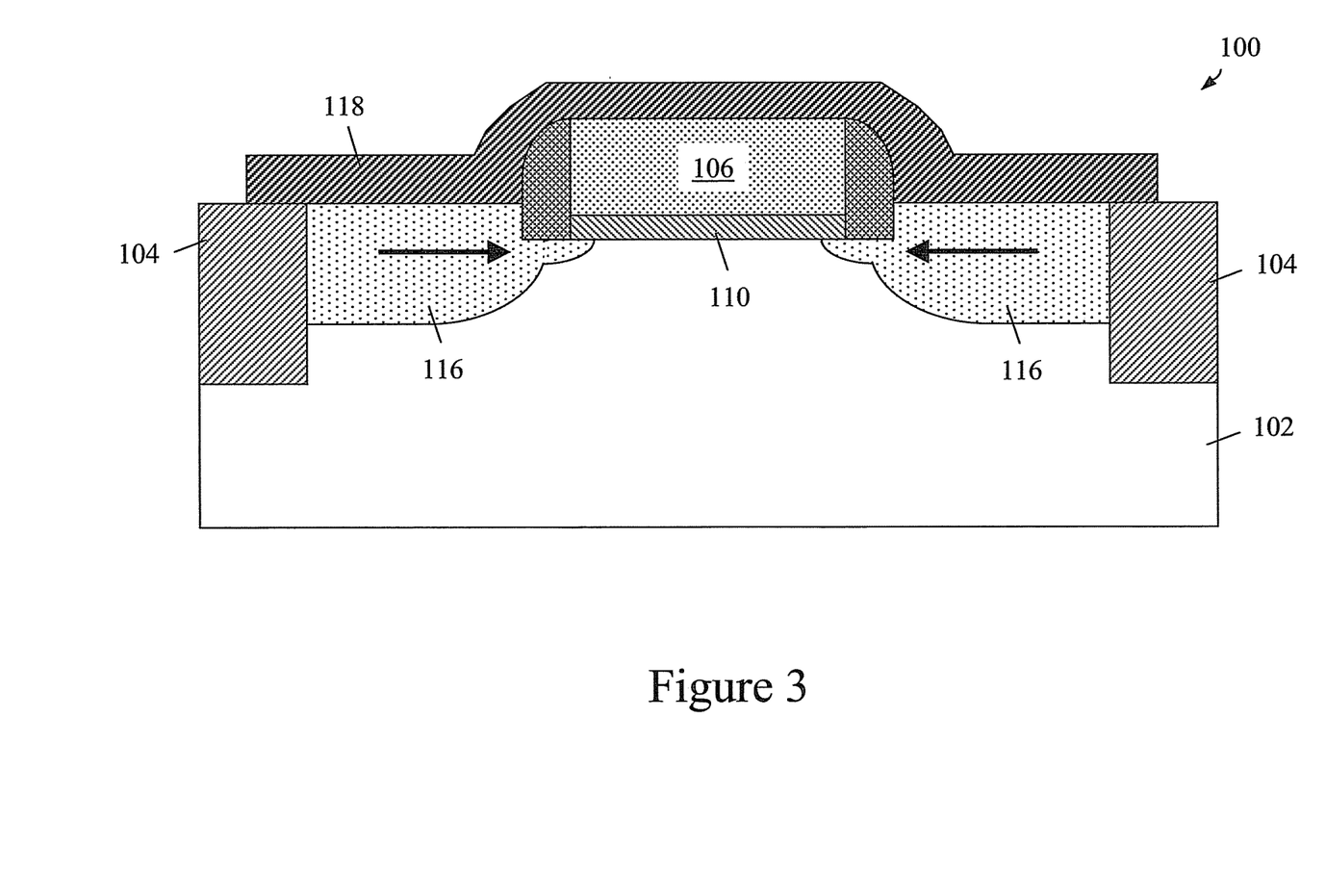
FIG. 3 illustrates the formation of a compressive nitride stress layer over an FET having a gate dielectric layer that is ferroelectrically controllable by strain engineering, in accordance with another embodiment of the invention.

In addition to, or in lieu of, an epitaxial source/drain stress exerting semiconductor material, other uniaxial stress/strain techniques can also be used to induce/modulate ferroelectric properties of dielectric layers. As shown in FIG. 3, the substrate 102 of the FET 100 is doped with a suitable dopant material to form source and drain regions 116 (as well as source/drain extension regions beneath the gate). That is, in the embodiment of FIG. 3, a stress is not generated from the source/drain semiconductor material. Instead, a nitride liner 118 (e.g., silicon nitride) is formed over the FET 100. In the example depicted, the nitride layer 118 is a compressive nitride layer, in that it provides a uniaxial compressive stress on both the channel region of the substrate 102 and the gate dielectric layer 110. In addition to inducing/modulating ferroelectric properties in the gate dielectric layer 110, as discussed above, the compressive nitride layer 118 is also used to enhance carrier mobility in PMOS FET devices.

Figure 4:
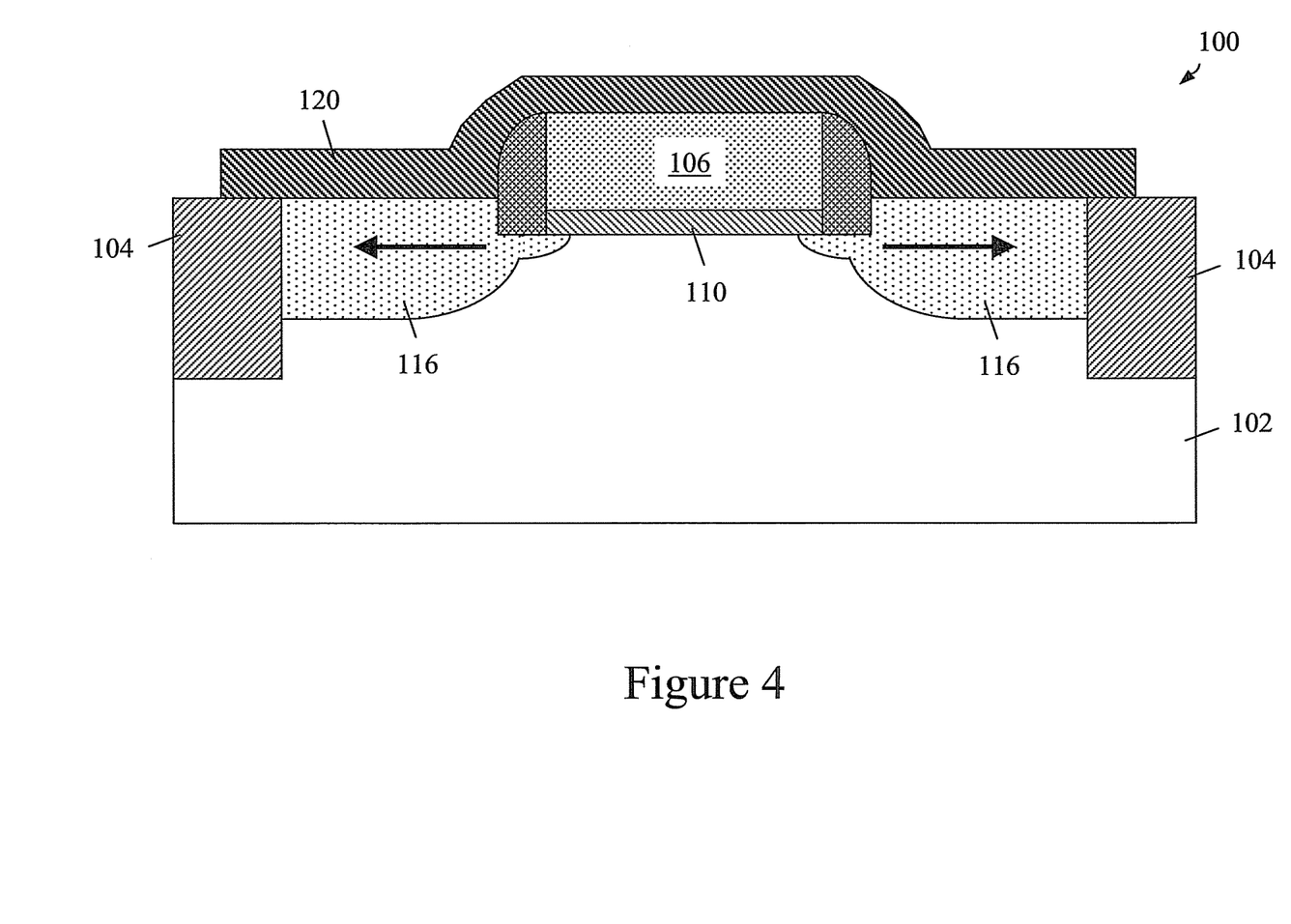
FIG. 4 illustrates the formation of a tensile nitride stress layer over an FET having a gate dielectric layer that is ferroelectrically controllable by strain engineering, in accordance with another embodiment of the invention.

By way of comparison, FIG. 4 illustrates the FET 100 with a tensile nitride liner 120 that generates a uniaxial tensile stress on both the channel region of the substrate 102 and the gate dielectric layer 110. In addition to inducing/modulating ferroelectric properties in the gate dielectric layer 110, as discussed above, the tensile nitride layer 120 is also used to enhance carrier mobility in NMOS FET devices.

Figure 5A:
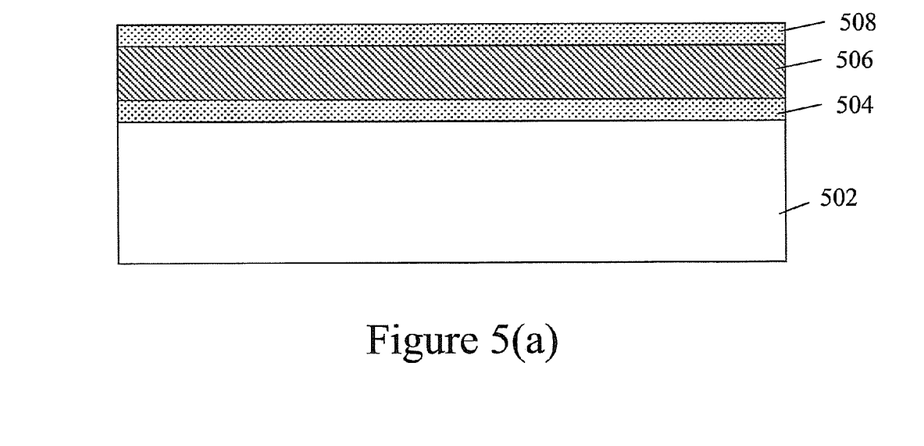
FIGS. 5(a) through 5(d) are a series of cross-sectional views illustrating the formation of a MIM capacitor having a dielectric layer that is ferroelectrically controllable by strain engineering, in accordance with another embodiment of the invention.

Referring generally now to FIGS. 5(a) through 5(d), there is shown a series of cross-sectional views illustrating the formation of a MIM capacitor having a ferroelectrically controllable dielectric layer, in accordance with another embodiment of the invention. In FIG. 5(a), a substrate 502 has a lower electrode layer 504, a capacitor dielectric layer 506 including ferroelectrically controllable layer and an upper electrode layer 508 formed thereon in sequence as a stack. As is the case for the FET embodiments, the ferroelectrically controllable layer includes a ferroelectric layer or a normally non-ferro electric layer that exhibits ferroelectric properties upon application of an external stress thereto. Any suitable conductive materials may be used for the lower and upper electrode layers 504, 508, including for example, platinum, iridium, ruthenium, titanium, titanium nitride, tantalum, tantalum nitride, iridium oxide, ruthenium oxide, copper, tungsten, or compounds thereof.

Similar to the FET embodiment, the capacitor dielectric layer 506 of the MIM capacitor, in addition to the ferroelectrically controllable layer, may also include one or more buffer layers and/or one or more additional dielectric layers disposed between the ferroelectrically controllable layer and the lower and upper electrode layers 504, 508.

Figure 5B:
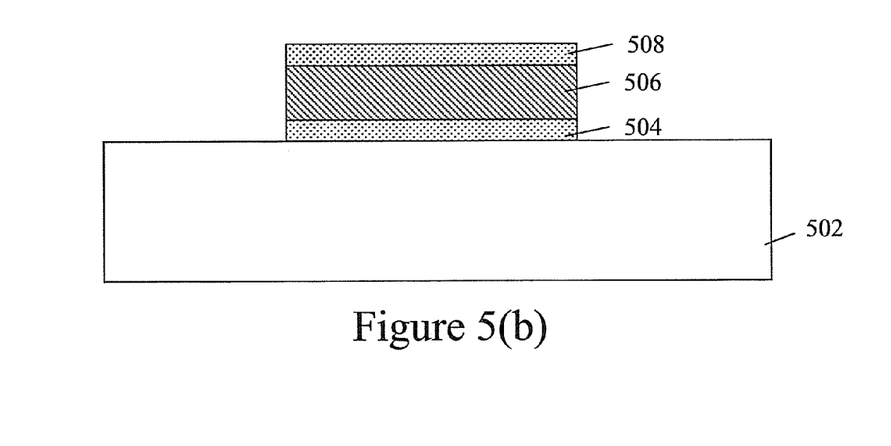
Figure 5C:
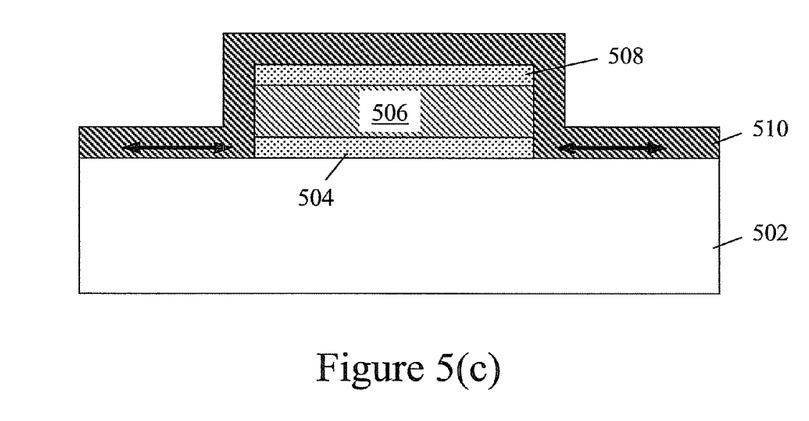
Figure 5D:
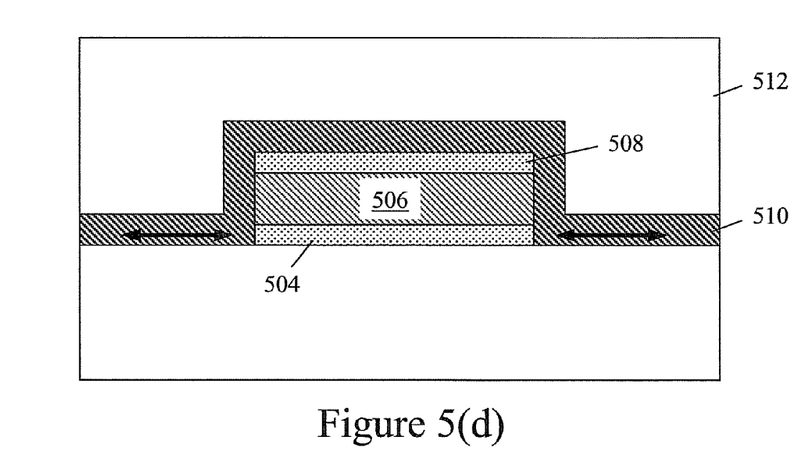

In FIG. 5(b), the lower electrode layer 504, ferroelectrically controllable layer 506 and upper electrode layer 508 are etched to a desired shape, followed by formation of a nitride stress layer 510 over the resulting capacitor stack, as shown in FIG. 5(c). The nitride stress layer 510 may be made to be either tensile or compressive, as indicated by the arrows. As a result, ferroelectric properties of MIM capacitor are induced/modulated due to the uniaxial stress/strain. Finally, in FIG. 5(d), an insulating layer (e.g., silicon dioxide) 512 is formed over the stressed ferroelectric MIM capacitor for further device processing.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A ferroelectric field effect transistor (FET) device, comprising:
    a ferroelectrically controllable gate dielectric layer disposed between a gate electrode and a substrate; and
    a stress exerting structure formed proximate the ferroelectrically controllable dielectric layer such that a substantially uniaxial strain is induced in the ferroelectrically controllable dielectric layer by the stress exerting structure, the substantially uniaxial strain comprising a strain introduced in one direction of a surface of the ferroelectrically controllable gate dielectric layer;
    wherein the ferroelectrically controllable gate dielectric layer comprises one or more of: a ferroelectric oxide layer and a normally non-ferroelectric material layer that does not exhibit ferroelectric properties in the absence of an applied stress.

2. The device of claim 1, wherein the ferroelectrically controllable gate dielectric layer comprises one or more of: $BaTiO_3$, $Pb[Zr_xTi_{1-x}]O_3$ (PZT), $SrBi_2Ta_2O_9$ (SBT), $SrTiO_3$ (STO), $Ba_{1-x}Sr_xTiO_3$ (BST), $PbTiO_3$, $CaMnO_3$ and $BiFeO_3$.

3. The device of claim 1, wherein the substrate is a silicon substrate and the stress exerting structure comprises epitaxially grown silicon germanium source and drain regions that induce a compressive uniaxial strain in the ferroelectrically controllable dielectric layer.

4. The device of claim 1, wherein the substrate is a silicon substrate and the stress exerting structure comprises epitaxially grown carbon doped silicon source and drain regions that induce a tensile uniaxial strain in the ferroelectrically controllable dielectric layer.

5. The device of claim 1, wherein the stress exerting structure comprises a compressive nitride layer formed over the FET.

6. The device of claim 1, wherein the stress exerting structure comprises a tensile nitride layer formed over the FET.

7. The device of claim 1, wherein the gate dielectric layer further comprises one or more additional dielectric layers.

8. A ferroelectric metal-insulator-metal (MIM) capacitor, comprising:
    a lower electrode layer formed over a substrate;
    a capacitor dielectric layer comprising a ferroelectrically controllable dielectric layer formed over the lower electrode;
    an upper electrode layer formed over the ferroelectrically controllable dielectric layer; and
    a stress exerting structure formed proximate the ferroelectrically controllable dielectric layer such that a substantially uniaxial strain is induced in the ferroelectrically controllable dielectric layer, the substantially uniaxial strain comprising a strain introduced in one direction of a surface of the ferroelectrically controllable dielectric layer;
    wherein the ferroelectrically controllable gate dielectric layer comprises one or more of: a ferroelectric oxide layer and a normally non-ferroelectric material layer that does not exhibit ferroelectric properties in the absence of an applied stress.

9. The device of claim 8, wherein the ferroelectrically controllable gate dielectric layer comprises one or more of: $BaTiO_3$, $Pb[Zr_xTi_{1-x}]O_3$ (PZT), $SrBi_2Ta_2O_9$ (SBT), $SrTiO_3$ (STO), $Ba_{1-x}Sr_xTiO_3$ (BST), $PbTiO_3$, $CaMnO_3$ and $BiFeO_3$.

10. The device of claim 8, wherein the stress exerting structure comprises a compressive nitride layer formed over the MIM capacitor.

11. The device of claim 8, wherein the stress exerting structure comprises a tensile nitride layer formed over the MIM capacitor.

12. The device of claim 8, wherein the capacitor dielectric layer further comprises one or more additional dielectric layers.

13. A ferroelectric field effect transistor (FET) device, comprising:
    a ferroelectrically controllable gate dielectric layer disposed between a gate electrode and a substrate; and
    a stress exerting structure formed proximate the ferroelectrically controllable dielectric layer such that a substantially uniaxial strain is induced in the ferroelectrically controllable dielectric layer by the stress exerting structure;
    wherein the ferroelectrically controllable gate dielectric layer comprises a normally non-ferroelectric material layer that does not exhibit ferroelectric properties in the absence of an applied stress.

14. The device of claim 13, wherein the ferroelectrically controllable dielectric layer comprises one or more of: $SrTiO_3$ and $CaMnO_3$.

* * * * *